US006465044B1

(12) United States Patent
Jain et al.

(10) Patent No.: US 6,465,044 B1
(45) Date of Patent: Oct. 15, 2002

(54) CHEMICAL VAPOR DEPOSITION OF SILICON OXIDE FILMS USING ALKYLSILOXANE OLIGOMERS WITH OZONE

(75) Inventors: Sanjeev Jain, Santa Cruz; Zheng Yuan, Fremont, both of CA (US)

(73) Assignee: Silicon Valley Group, Thermal Systems LLP, Scotts Valley, CA (US)

( * ) Notice: Subject to any disclaimer, the term of this patent is extended or adjusted under 35 U.S.C. 154(b) by 0 days.

(21) Appl. No.: 09/542,612

(22) Filed: Apr. 4, 2000

Related U.S. Application Data

(60) Provisional application No. 60/143,198, filed on Jul. 9, 1999.

(51) Int. Cl.[7] .................. C23C 16/00; H01L 21/469
(52) U.S. Cl. .............. 427/255.37; 427/294; 427/585; 427/588; 438/787
(58) Field of Search .................. 427/255.37, 294, 427/585, 588; 438/787

(56) References Cited

U.S. PATENT DOCUMENTS

| | | | |
|---|---|---|---|
| 5,028,566 A | 7/1991 | Lagendijk | 437/238 |
| 5,521,126 A | 5/1996 | Okamura et al. | 437/235 |
| 5,909,314 A | 6/1999 | Oka et al. | 359/582 |

OTHER PUBLICATIONS

Lin, et al. "Modeling and Analysis of CVD Processes in Porous Media for Ceramic Composite Preparation", Chemical Engineering Science, vol. 46, No. 12, 1991, pp. 3067–3080. (No month avail.).

Yuan, et al. "Optimizatino of $SiO_2$ Film Conformality in $TEOS/O_3$ APCVD"m Thin Solid Films, 290–291, 1996, pp. 422–426. (No month avail.).

Shareef, et al. "Role of Gas Phase Reactions in Subatmospheric Chemical–Vapor Deposition Ozone/TEOS processes for Oxide Deposition", J. Vac. Sci. Technol. B 14(2), Mar/Apr. 1996, pp. 772–774.

Egashira, et al. "Step–Coverage Simulation for Tetraethoxysilane and Ozone Atomspheric Pressure Chemical Vapor Deposition ", J. Electrochem. Soc., vol. 140, No. 8, Aug. 1993, pp. 2309–2312.

Jain, et al. "Synthesis of Composite Films", Chem. Vap. Deposition, vol. 4, No. 6, 1998 pp. 253–257. (No month avail.).

Ikeda, et al. "The Effects of Alkoxy Functional Groups on Atmospheric–Pressure Chemical Vapor Deposition Using Alkoxysilane and Ozone", J. Electrochem. Soc., vol. 142, No. 5, May 1995, pp. 1659–1662.

Lindley, et al. "The Orthobaric Region of Octamethyltrisiloxane", Fluid Phase equilibria, vol. 55, 1990, pp. 109–124. (No month avail.).

Murase, et al. "Thermal Desorption Studies of Silicon Dioxide Deposited by Atmospheric–Pressure Chemical Vapor Deposition using Tetraethylorthosilicate and Ozone", J. Electrochem. Soc., Vol. 140, No.6, Jun. 1993 pp. 1722–1727.

IslamRaja, et al. "Two Precursor Model for Low–Pressure Chemical Vapor Deposition of Silicon Dioxide From Tetraethylorthosilicate", J. Vac. Sci. Technol. B 11(3), May/Jun. 1993, pp. 720–726.

(List continued on next page.)

Primary Examiner—Bernard Pianalto
(74) Attorney, Agent, or Firm—Flehr Hohbach Test Albritton & Herbert LLP

(57) ABSTRACT

This invention relates to a method of depositing silicon oxide films on the surface of semiconductor substrates, and more particularly to depositing such films by chemical vapor deposition using alkylsiloxane oligomers precursors with ozone.

6 Claims, 15 Drawing Sheets

A SCHEMATIC OF THE EXPERIMENTAL SYSTEM

OTHER PUBLICATIONS

Nakano, et al. "A Model of Effects of Surface Pretreatment by Organic Solvents on Ozone–Tetraethoxysilane Chemical Vapor Deposition", J. Electrochem. Soc., Vol. 142, No. 2, Feb. 1995 pp. 641–644.

Kim, et al. "Analytical Model for Chemical Vapor Deposition of $SiO_2$ Films using Tetraethoxysilane and Ozone", Journal of Crystal Growth, No. 140, 1994, pp. 315–326. (No month avail).

Ikeda, et al. "Characteristics of Silicon Dioxide Films on Patterned Substrates Prepared by Atompheric–Pressure Chemical vapor Deposition Using Tetraethoxysilane and Ozone", J. Electrochem. Soc., Vol. 143, No. 5, May 1996, pp. 1715–1718.

Hazari, et al. "Characterization of Alternative Chemistries for Depositing PECVD Silicon Dioxide Films", DUMIC Conference, Feb. 16–17, 1998 pp. 319–326.

Garcia, et al. "Chemical Vapor Deposition of Silicon Dioxide from Hexamethyldislazane and Ozone/Oxygen", Journal of Chemical Vapor Deposition, Vol. 1, Jan. 1993, pp. 232–251.

Robles, et al. "Gap Fill and Film Reflow Capability of Subatmospheric Chemical Vapor Deposited Borophosphosilicate Glass", J. Electrochem. Soc., Vol. 143, No. 4, Apr. 1996 pp. 1414–1421.

Fujino, et al. "Low Temperature and Atmospheric Pressure CVD Using Polysiloxane, OMCTS, and Ozone", J. Electrochem. Soc., Vol. 138, No. 12, Dec. 1991, pp. 3727–3732.

Fujino, et al. "Low–Temperature Atmospheric–Pressure Chemical Vapor Deposition Using 2,4,6,8–Tetramethylcotetrasiloxane and Ozone", Jpn. J. Appl. Phys. Vol. 33, 1994, pp. 2019–2024. (No month avail.).

Fujino, et al. "Low Temperature, Atmospheric Pressure CVD Using Hexamethyldisiloxane and Ozone", J. Electrochem. Soc., Vol. 139, No. 8, Aug. 1992 pp. 2282–2287.

A SCHEMATIC OF THE EXPERIMENTAL SYSTEM

A DETAILED SCHEMATIC OF THE LINEAR INJECTOR

GAP FILL USING TEOS AT 450°C, 600 torr AND $O_3$:Si = 10.3

GAP FILL USING OMTS AT 500°C, 200 torr AND $O_3$:Si OF ~ 5.0

GAP FILL USING OMTS AT 500°C, 200 torr AND $O_3$:Si OF ~ 11.0

TEOS AT 500°C O₃:Si = 12

TEOS AT 550°C O₃:Si = 12

TEOS AT 450°C O$_3$:Si = 12

OMTS AT 500°C $O_3$:Si = 12

OMTS AT 550°C $O_3$:Si = 12

OMTS AT 450°C O$_3$:Si = 12

CHEMICAL VAPOR DEPOSITION OF SILICON OXIDE FILMS USING ALKYLSILOXANE OLIGOMERS WITH OZONE

This application claims benefit to U.S. provisional application Ser. No. 60/143,198, filed Jul. 9, 1999.

FIELD OF THE INVENTION

This invention relates to a method of depositing silicon oxide films on the surface of semiconductor substrates, and more particularly to depositing such films by chemical vapor deposition using alkylsiloxane oligomers precursors with ozone.

BACKGROUND OF THE INVENTION

Chemical vapor deposition (CVD) of silicon dioxide is a widely used manufacturing technology for the deposition of dielectric films or layers used in the production of semiconductors. There are two main CVD processes currently used to deposit silicon dioxide ($SiO_2$) on semiconductor substrates or wafers. The two main processes are a silane/oxygen ($SiH_4/O_2$) process and a triethoxysilane/ozone ($TEOS/O_3$) process. Of these, the $TEOS/O_3$ process has been widely employed in semiconductor manufacturing due to the superior quality of the $SiO_2$ films deposited by this process, especially with regard to the gap filling capability of the film. This advantage becomes especially important in light of the decreasing feature sizes and increasing aspect ratios of the semiconductor device features in the present day very large scale integrated (VLSI) manufacturing. Thus, efforts have been made to enhance the gap filling capability of the $TEOS/O_3$ process.

Apart from the work on understanding and improving the $TEOS/O_3$ process for better gap fill ability, efforts have also been made to identify new organosilicon precursors that could be used to deposit $SiO_2$ films of quality superior or comparable to those deposited by the $TEOS/O_3$ process. These new organosilicon precursors include hexamethyldisiloxane (HMDSO), hexamethyl disilazane (HMDS), octamethylcyclotetrasiloxane (OMCTS) and 2,4,6,8-tetramethylcyclo tetra siloxane (TMCTS). The $SiO_2$ films deposited from these precursors had properties similar or poorer compared to the films deposited using $TEOS/O_3$ and therefore offered no advantage over the already very established $TEOS/O_3$ chemistry.

In the development of new chemical precursors, the different types of CVD systems must be considered. A variety of CVD systems are utilized in the semiconductor industry, and are typically divided into two groups: thermal systems and plasma enhanced systems. Thermal systems utilize thermal energy to disassociate the chemical precursors, where they react and deposit a layer or film on the substrate. Thermal CVD systems typically operate at atmospheric pressure (referred to as APCVD systems) or low pressure (referred to as LPCVD systems). In contrast, plasma enhanced systems utilize ionized gases (i.e., a plasma) to disassociate the chemicals. While the two types of systems are used to perform the same function, i.e. to deposit a layer on a substrate, the systems have very different reactor and system designs, and operate under very different reaction kinetics and process conditions. It has been found that while one process chemistry may work well for one type of CVD system, it is not well suited for the other type of CVD system. For example, silane and oxygen ($SiH_4/O_2$) as precursors are very reactive, and can be explosive, and due to this problem the $TEOS/O_3$ precursor chemistry has found wide use in the thermal CVD type systems. The $TEOS/O_2$ precursor chemistry has been found to be suitable when employed in plasma CVD type systems, however $TEOS/O_3$ precursor chemistry has not. $SiH_4/O_2$ precursor chemistry has found use in plasma CVD systems.

While the above described precursor chemistry has found wide use in the semiconductor industry, there is a continuing need for the development of improved precursor chemistry and their processes, particularly as device densities decrease and the demands on the gap filling properties of the films increase. Moreover, the cost and/or consumption of certain conventional precursors is high, and it is desirable to develop new, less expensive and/or lower consumption precursors.

SUMMARY OF THE INVENTION

Accordingly, it is an object of the present invention to provide an improved precursor chemistry and method of depositing oxide films or layers on the surface of semiconductor substrates.

It is a related object of the present invention to provide a method of depositing a film which promotes reduced cost of ownership (CoO) of the CVD system.

In the present invention, a method of depositing oxide films or layers using volatile alkylsiloxane precursors is provided. Specifically, the alkylsiloxane precursors of the invention are of the formula: $(CH_3)_3Si[OSi(CH_3)_2]nOSi(CH_3)_3$ where n=1 and 2. Such precursors thermally react with ozone to produce silicon dioxide for depositing on the surface of semiconductor substrates, and of significant advantage are particularly useful for sub 0.18 micron device applications. In fact, a dimer of such alkylsiloxane, hexamethyldisiloxane, has been investigated earlier. Of particular advantage, the process is a thermal CVD method and does not require the complex addition of plasma CVD technologies. In addition, by co-injection of dopant precursors such as phosphorus and/or boron precursors with the alkylsiloxane precursor in the presence of ozone, phosphorusilicate glass (PSG), borosilicate glass (BSG) and borophosphorusilicate glass (BPSG) films can also be formed using the thermal CVD method of the present invention. The inventors have found that significantly lower chemical usage and excellent gap fill can be achieved by using the method of the present invention as compared to using conventional TEOS, where the same film quality and deposition rate were maintained. Further, according to one embodiment of the present invention, octamethyltrisiloxane (OMTS) was mixed with ozone in the gas phase. It was found that this OMTS process generated less particulates in the exhaust lines as compared with conventional TEOS processes, which can significantly reduce chamber exhaust cleaning during high volume manufacturing. The inventors have also found that the deposition rate of silicon dioxide according to the method of the present invention is much less sensitive to wafer temperature than conventional processes, which is a very significant factor towards improvement of the silicon dioxide deposition thickness uniformity.

BRIEF DESCRIPTION OF THE DRAWINGS

Other objects and advantages of the present invention will become apparent upon reading the detailed description of the invention and the appended claims provided below, and upon reference to the drawings, in which:

DETAILED DESCRIPTION OF THE INVENTION

A method of depositing an oxide film or layer on the surface of a substrate by thermal chemical vapor deposition using alkylsiloxane precursor is provided. Specifically, the alkylsiloxane precursor has the general formula of:

$(CH_3)_3Si[OSi(CH_3)_2]n\ OSi(CH_3)_3$ where n is 1 or 2.

Thus, suitable alkylsiloxane precursors of the present invention include: octamethyltrisiloxane (OMTS) and decamethyltetrasiloxane. The alkylsiloxane precursor is reacted with ozone in thermal CVD system to deposit a layer or film of oxide (such as silicon dioxide) on the surface of a substrate.

The method of the present invention further comprises thermally reacting the alkylsiloxane precursor and ozone in the deposition chamber to deposit an oxide film on the surface of the substrate. The thermal reaction is carried out at a temperature in the range of approximately 300° C. to 600° C., preferably at a temperature in the range of approximately 350° C. to 550° C. with a temperature in the range of approximately 450° C. to 550° C. being most preferred. The reaction may be carried out at different pressures in the CVD chamber. In one embodiment, the method is carried out at low pressure, specifically in the range of approximately 100 to 700 torr, and more preferably at a pressure of approximately 200 to 600 torr. In an alternative embodiment, the method is carried out at atmospheric pressure, i.e. approximately 760 torr.

Another important aspect of the present inventive method is the concentration ratio of the reactants, or Mol %, specifically, the molar ratio of the ozone to the silicon content in the alkylsiloxane precursor (expressed as: $O_3$:Si). When operating at low pressure, the mol ratio of ozone to silicon is in the range of approximately 3 to 20 Mol %, more preferably in the range of approximately 5 to 15 Mol %, with an $O_3$:Si ratio of 6 to 14 Mol % being most preferred. When operating at atmospheric pressure, the molar ratio of ozone to silicon is in the range of approximately 3 to 20 Mol %, more preferably in the range of approximately 5 to 15 Mol %, with an $O_3$:Si ratio of 6 to 14 Mol % being most preferred. To achieve such concentration ratios, the gas flow rates of the alkylsiloxane precursor will be selected appropriately. The actual values of the gas flow rates will vary depending upon a number of known factors, such as the equipment design, operating pressure and the deposition rate desired.

Figure 1:
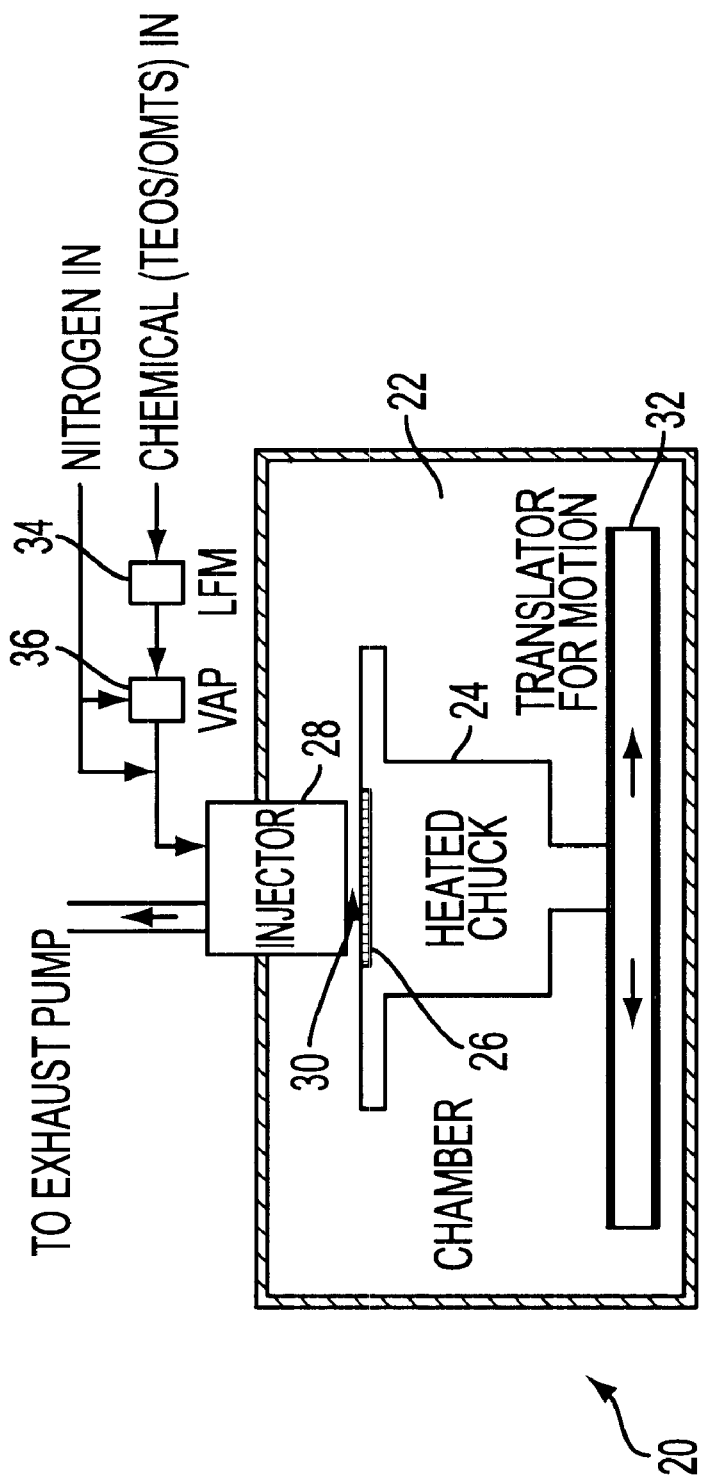
FIG. 1 is a schematic diagram of one embodiment of an CVD system which may be employed with the method of the present invention.

A thermal CVD system 20 suitable for practicing the method of the present invention is illustrated in FIG. 1. FIG. 1 is a simplified schematic diagram of the CVD system 20 which generally includes a CVD chamber 22 which houses a heated chuck or susceptor 24 for supporting a wafer or substrate 26 adjacent an injector 28. A deposition region 30 is formed between the injector 28 and the substrate 26. The substrate may be moved relative to the injector 28 via translation means 32. It is important to note that while one CVD system is shown, the inventive method may be practiced with other thermal CVD systems, such as for example a conveyorized atmospheric pressure CVD (APCVD) system as described in U.S. Pat. No. 4,834,020 which is hereby incorporated by reference.

The alkylsiloxane precursors of the present invention are typically in liquid form and must be vaporized before introduction to the injector 28. The liquid alkylsiloxane precursor is metered through a liquid flow meter (LFM) 34 and then vaporized in a commercially available directed liquid injector (DLI) 36. Vaporized alkylsiloxane precursor exits the DLI 36 and is then conveyed to the injector 28. The liquid precursor can also be vaporized using a bubbler. Bubblers are well known in the art and any type of suitable bubbler may be used such as that described in U.S. Pat. No. 5,078,922.

To deposit the film, the alkylsiloxane precursor and other reactive and inert gases are conveyed to the injector 28. One embodiment of an injector suitable for practice with the method of the present invention is shown in greater detail in FIG. 2. In general, the injector 28 consists of multiple cross channels, or plenums 40 running the length of the injector 28, each of which are coupled to common gas delivery surface 44 by narrow slot like channels 46, which also extend the length of the injector 28. Gases exit the gas delivery surface 44 to the deposition region 30 just above the wafer substrate 26. In the low pressure embodiment, preferably, the deposition gases are fed separately to each of the plenums 40. Exhaust channels 48 are provided to remove unreacted gases and by products from the deposition region 30. A pump (not shown) may be used to exhaust the chamber. In the low pressure embodiment, preferably the pressure in the chamber is in the range of approximately 200 to 600 torr. In the atmospheric pressure embodiment, the pressure in the chamber is maintained at about 760 torr. The injector is further described in U.S. Pat. No. 5,683,516 and patent application Ser. No. 09/113,823 which are both hereby incorporated by reference. Although one specific example of an injector has been described, it is to be understood that many other types of injectors are suitable for practicing the method of the present invention.

To deposit the film, the vapor phase alkylsiloxane is preferably diluted with an inert gas, such as nitrogen, and flowed to the injector 28. Other reactant gases, in this case ozone ($O_3$) are also conveyed to the injector 28. Alkylsiloxane vapor mixes with ozone at the outlet of the gas injector and is delivered to the surface of the wafer or substrate. Preferably the substrate is heated to a temperature in the range of approximately 300 to 600° C. when the pressure is either in the range of 200 to 600 torr, or at atmospheric pressure.

The alkylsiloxane reacts in the gas phase with ozone to form additional intermediates. The deposition rate can be a function of this rate as well depending on the operating conditions. The alkylsiloxanes and the intermediates diffuse to the heated surface and then react to form the solid film on the surface of the substrate.

Of particular advantage, the alkylsiloxane precursor of the present invention contains more than one Si atom per molecule of precursor. The conventional TEOS precursor contains only one Si atom per molecule of precursor. Thus, the total amount of the precursor used according to the present invention can be reduced, as compared to the equivalent amount of TEOS, while achieving the same deposition rate. Using less precursor has significant advantages; for example, it inhibits powder formation and also results in a smaller quantity of by-products being formed as compared to the conventional TEOS/ozone process. Therefore, the longevity of the systems which are affected by the by-product and powder formation can be enhanced and problems of powder formation can be mitigated.

Moreover, because a molecule of the alkylsiloxanes have more than one atom of Si in contrast to TEOS, the amount of silicon dioxide deposited is greater in the method of the invention. Further, the diffusion rate for the alkylsiloxanes has been found to be only marginally smaller compared to TEOS. These two factors result in a comparable or enhanced gap fill ability of the precursor according to the present invention when compared to conventional TEOS.

In another aspect of the present invention, the alkylsiloxane precursor can be mixed with dopant sources such as alkylborate and/or alkylphosphate or alkylphosphite in the vapor phase and co-injected with ozone on to the substrate surface to produce doped silicon dioxide such as BSG, PSG and BPSG.

Of particular advantage, the method of the present invention provides for introducing more than one Si atom using the same amount of the precursor molecules which allows for a higher deposition rate when the equivalent amount of conventional TEOS precursor is used. Alternately, the same throughput as that obtained from the conventional TEOS/$O_3$ process can be achieved by using a lower amount of alkylsiloxane chemical. This can lower the cost of ownership (CoO) of operating the semiconductor processing equipment by as much as 3 times or more.

By introducing a lower amount of chemical without reducing the deposition rate according to the present invention, powder formation due to gas-phase reactions is mitigated, because gas phase reaction is a function of chemical concentration in the gas-phase. Consequently, the cleaning overhead of deposition in the chamber and exhausted areas can be reduced significantly, providing a significant advantage. Further, the lower flow rate reduces the formation of by-products. This enhances the longevity of the components of the CVD system which degrade and corrode over time from exposure and attack by these by-products.

Of further significant advantage the inventors have discovered that films deposited according to the precursor and method of the present invention exhibit lower temperature sensitivity as compared to films deposited by conventional TEOS process. TEOS is very temperature sensitive. The temperature sensitivity of the precursor has a significant effect on the thickness uniformity of the film deposited on the wafer. This in turn puts strict demands on the deposition equipment, and particularly the wafer support, to provide uniform heating. Currently, films deposited with TEOS process are limited and have not been able to achieve film non-uniformities below about 2% and there is a need in the industry to achieve lower non-uniformities on the order of about 1%.

A number of examples are provided below. According to the method of the present invention, octamethyltrisiloxane (OMTS) was tested and films deposited with OMTS were evaluated and compared to the conventional TEOS/$O_3$ process. The following examples are set forth for illustration purposes only and are not intended to limit the scope of the invention in any way.

Certain properties of OMTS and TEOS are listed in Table 1 below. According to one embodiment of the present invention, the method was carried out with OMTS at a temperature range of 300–500° C., at a variable pressure range of about 200–600 torr (i.e. low pressure), and using $O_3$ as the co-reactant. Films were also deposited with TEOS for comparison. The effect of varying temperature, pressure and $O_3$ concentration on the deposition rate and carbon content of the deposited films was studied. The film qualities such as etch rate, shrinkage, carbon content and stress of the as-deposited films were compared to the $SiO_2$ films deposited from a conventional TEOS/$O_3$ process. The gap filling capability of the films deposited from OMTS and TEOS were also studied. According to another embodiment of the present invention, the method is carried out at atmospheric pressure. The effects of varying temperature and $O_3$ concentration on the deposition rate and carbon control of the deposited film is also studied as well as the film qualities.

Experiments Conducted Using Variable Pressure (Low Pressure)

Films were deposited on 200 mm p-type [100] silicon substrates under a variety of process conditions. Specifically, films were deposited using OMTS according to the present invention. Films were also deposited using conventional TEOS for comparison. The process conditions are set forth in Table 2 below:

TABLE 1

Physical Properties of OMTS and TEOS

| Precursor | OMTS | TEOS |
|---|---|---|
| Formula | $C_8H_{24}O_2Si_3$ | $C_8H_{20}O_4Si$ |
| Molecular weight | 236 | 208 |
| Freezing point | −82° C. | −85° C. |
| Boiling point | 153° C. | 167° C. |
| Specific gravity | .81 | .94 |
| Vapor pressure data | $\ln P_v(kPa) = 141.67 - \left(\frac{10826.6}{T(K)}\right) - 18.8 \ln T(K) + 1.23 \times 10^{-5} T(K)^2$ | $\ln P_v(torr) = 19.3197 - \left(\frac{5562.3}{T(K)}\right)$ |
| Vapor pressure @ 20° C. | 4 torr | 2 torr |

Figure 2:
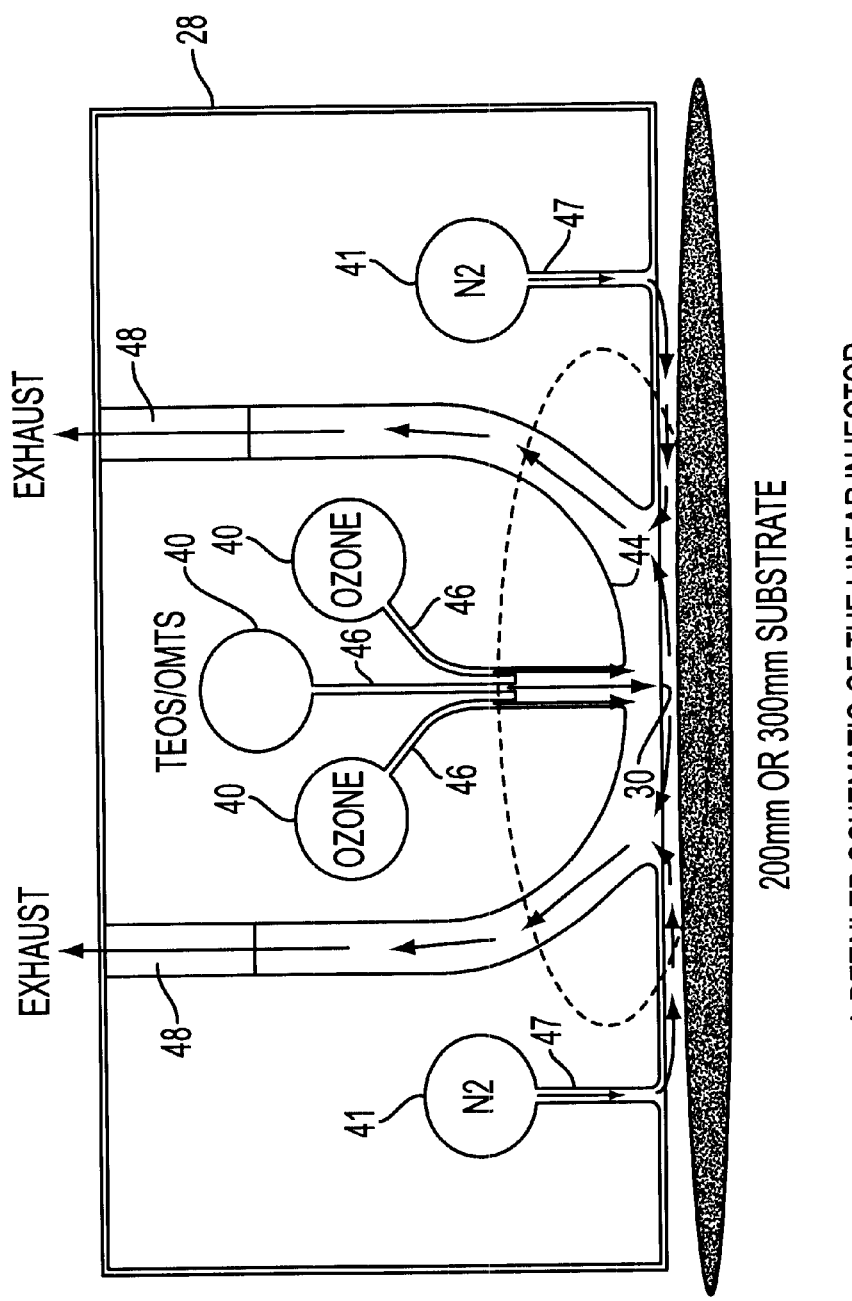
FIG. 2 is a schematic diagram of one embodiment of an injector which may be employed with the method of the present invention.

The experiments were conducted in a CVD system equipped with a linear injector as shown in FIGS. 1 and 2, respectively. A vacuum pump (not shown) is attached to the chamber and isolated through a valve so that the pressure of the chamber can be controlled below atmospheric conditions. The liquid flow rates of TEOS and OMTS are controlled by a liquid flow meter (LFM) and sent to the DLI where all of the injected fluid is completely vaporized. The vaporizer temperature is monitored and controlled using a temperature controller. The vapor is then introduced through the inner port 40 of the injector as shown in FIG. 2 along with dilution nitrogen. The lines from the DLI 36 to the injector 28 are heated to 120° C. to prevent condensation of the precursor vapor.

Ozone is generated by passing oxygen through a Sumitomo (Model SGN-04CUA-95-8) ozone generator (not shown). The output from the ozone generator consists of a mixture of oxygen and ozone which is introduced in the reactor through the outer port 40 of the injector 28, along with nitrogen as a dilution gas. The ozone concentration can be varied by varying the power supplied to the cells generating the ozone.

Ozone, OMTS and nitrogen gases are conveyed through the injectors into the process chamber. In this embodiment, the process chamber employs three injectors, and the gases are separately conveyed to ports 40 and each injector 28. Side ports 41 and channels 47 are used to provide nitrogen gas flow to the sides of the injectors 28 which helps to isolate the deposition region 30 and to reduce the buildup of powder formation on the surface of the injector 28 and chamber 22. The gases are exhausted through the exhaust channels 48 on either side of each injector 28. While a specific injector design is described, it should be understood by those of ordinary skill in the art that other injection and thermal CVD system configurations may be used to practice the method of the present invention.

The wafer is placed on an aluminum chuck 24 which is heated using Inconel heaters 26. The wafer surface temperature is measured using a thermocouple (TC) wafer with temperature calibration specification of ±1.6° C. at 400° C. to 500° C. The heated chuck 24 is coupled to the translator 32 such that the wafer may be moved below the injectors in a linear motion at varying speeds. This allows the deposition time to be controlled by controlling the speed of the chuck 24.

TABLE 2

Deposition Process conditions

| Pressure (torr) | 200–600 |
|---|---|
| Wafer temperature (° C.) | 300–500 |
| TEOS flow rate (mol/min) | $9 \times 10^{-3}$ |
| OMTS flow rate (mol/min) | $3 \times 10^{-3}$ |
| Ozone/oxygen flow rate (slm) | 30 |
| Ozone concentration (g/m³) | 75–165 |
| Inner port dilution nitrogen (slm) | 25 |
| Outer port dilution nitrogen (slm) | 25 |
| Separator nitrogen flow (slm) | 10 |
| Bubbler temperature (° C.) | 140 |

Three to five runs were conducted under each condition. The film thickness was measured using a Prometrix spectromap (Model SM200/E) using 49 points with a 10 mm edge exclusion because of the highly non-uniform deposition on the wafer. This is because the wafer temperature on during the experiment was highly non-uniform and varied from about 265° C. at the edge to about 301° C. in the center of the wafer. The deposition temperature reported in the present work therefore corresponds to the temperature at the center of the wafer. Despite the 10 mm edge exclusion the deposition uniformity varied from 7–15% 1σ. The uniformity improved as the temperature was increased from 300° C. to 500° C. This is because with increasing temperature, deposition becomes mass-transfer controlled rather than kinetically controlled, and therefore becomes a function of the gas flow field rather than the temperature profile. The above observation therefore suggests that the gas flow field was more uniform than the temperature profile.

The films were etched in a 30:1 BOE solution maintained at room temperature, and the thickness before and after the etch was measured to determine the etch rate. The wafers were annealed in a furnace (Canary, NOBLE IPS 812) at 900° C. for 30 min in a nitrogen ($N_2$) ambient. Shrinkage was determined by the thickness measurements before and after the anneal. Stress was measured on a stress gauge (Tencor, FLX-2410) in a dry $N_2$ ambient. The carbon content in the films was analyzed using quadrupole-based Secondary Ion Mass Spectrometry (SIMS) with an $O_2$ ion beam of 6 keV energy (Charles Evans & Associates, California). The patterned wafers were analyzed by Secondary Electron Microscopy (SEM) (Philips XL40 FEG) to measure the extent of gap fill.

The results of the experiments are now discussed. As mentioned above, each molecule of OMTS contains three atoms of silicon, compared to one atom of silicon in one TEOS molecule. Therefore, the comparison between the films deposited from TEOS and OMTS could be based on the mole basis of the precursor or mole basis of silicon (Si). The results discussed below, and that illustrated in the figures, are presented on mole basis of Si rather than the mole basis of the precursor molecule, and the implications of using it as a reference are discussed where pertinent.

The deposition temperature was varied from 300–500° C. and its effect on the deposition rate and film properties such as wet etch ratio, shrinkage and gap fill capability was studied. The pressure, ozone to silicon concentration ratio ($O_3$:Si), and Si flow rate were held constant at 200 torr, 10.3 and 0.009 mol/min, respectively. The results for TEOS and OMTS are compared and presented in FIGS. 3, 4 and 5.

Figure 3:
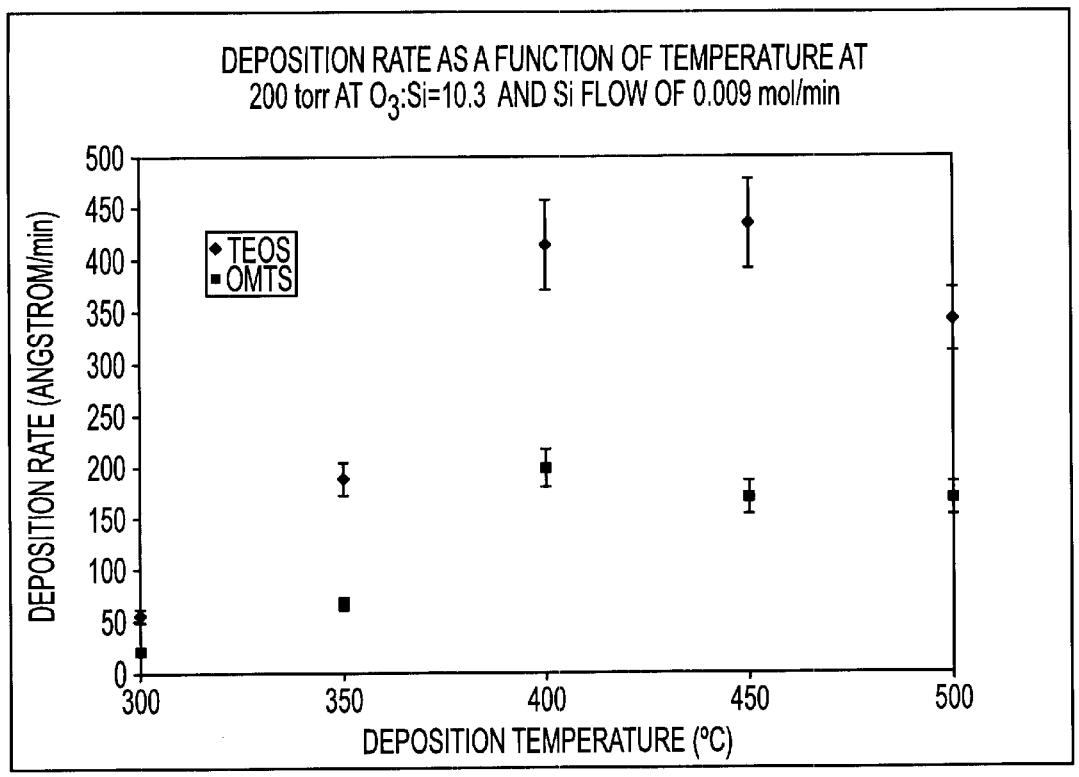
FIG. 3 is a graph showing the deposition rate as a function of temperature at 200 torr at $O_3$:Si=10.3 and Si flow of 0.009 mol/min for a conventional precursor and for one precursor according to the present invention.
Figure 4:
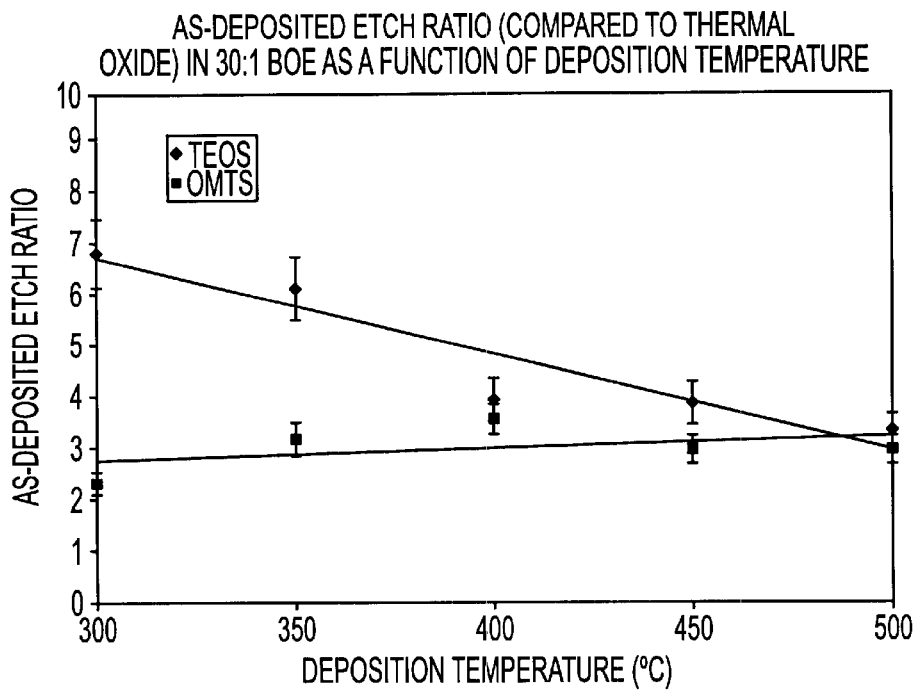
FIG. 4 is a graph illustrating the as-deposited etch ratio (compared to thermal oxide) in 30:1 BOE as a function of deposition temperature for a conventional precursor and for one precursor according to the present invention.

FIG. 3 illustrates the deposition rate as a function of temperature, and shows that the OMTS deposition rate increased from about 25 Å/min to 200 Å/min when the deposition temperature was increased from 300 to 400° C., and then decreased slightly with increase in temperature to 500° C. The deposition rate with TEOS showed a similar trend with temperature, although the deposition rate showed a significant drop when the temperature was increased to 500° C. This trend for $O_3$ based chemistry using different Si sources such as TEOS and OMCTS has been reported in the literature. The decrease in the deposition rate at higher temperatures can be attributed to parasitic gas-phase reactions. It has been shown that the temperature at which the deposition rate reaches a maximum decreases with increase in pressure for TEOS/$O_3$.

The deposition rate increased more rapidly with temperature in the case of TEOS compared to OMTS in the temperature range of 300–400° C. at 200 torr. This indicates that the variation in the film thickness due to variations in the wafer surface temperature will be lower for OMTS compared to TEOS, which is a desirable property.

FIG. 3 also shows that the deposition rate from OMTS was always lower than that from TEOS at a pressure of 200 torr even though the Si flow rate was the same. This is because the concentration of Si using OMTS was one-third that of TEOS as the OMTS flow rate was one-third that of the TEOS flow rate.

It is important to note that according to the method of the present invention, a deposition rate of nearly three times that shown in FIG. 3 could be achieved with OMTS by adjusting the leveling of the chuck and changing delivery line temperatures. The reason these rates are not reported is because the baseline was established under leveling conditions different from the optimum. This is very significant advantage because the same deposition rate provided by TEOS can be achieved by using only one-third the amount of OMTS. This provides a six-fold cost reduction because OMTS costs about half that of TEOS (TEOS~28 c/g and OMTS~16 c/g).

Another important property of the film is the wet etch ratio. The wet etch ratio (WER) was determined by comparing the etch rate of the deposited CVD film to the etch rate of a thermal oxide. The WER as a function of the deposition temperature is presented in FIG. 4 at 200 torr, $O_3$:Si=10 and Si flow of 0.009 mol/min. The data shows that the WER for films deposited with OMTS remained fairly constant at about 3 with changes in the deposition temperature, whereas the WER for films deposited with TEOS decreased from about 7 to about 3 when the deposition temperature was increased from 300° C. to 500° C. This suggests that the density of the films deposited from TEOS increased with an increase in the deposition temperature but was fairly constant with respect to the deposition temperature when OMTS was used.

Figure 5:
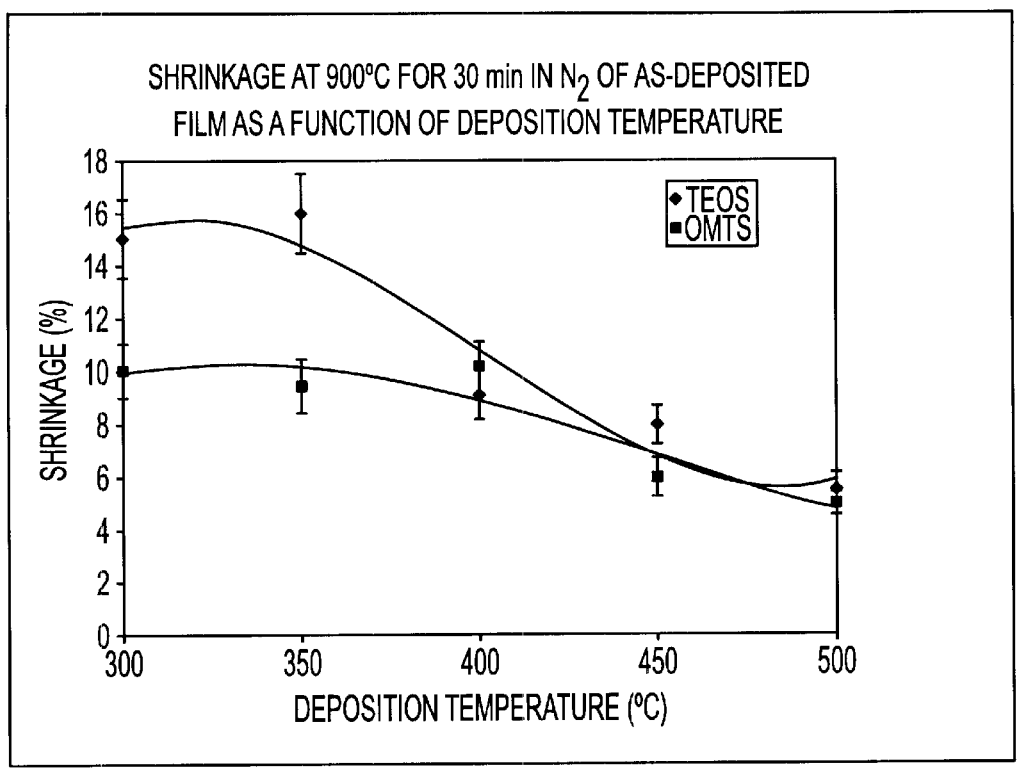
FIG. 5 is a graph showing the shrinkage at 900° C. for 30 minutes in $N_2$ of as-deposited film as a function of deposition temperature for a conventional precursor and for one precursor according to the present invention.

The shrinkage of the $SiO_2$ films deposited from TEOS and OMTS at different deposition temperatures is shown in FIG. 5. The pressure was held constant at 200 torr, a $O_3$:Si=10 and Si flow of 0.009 mol/min were used. The shrinkage of the films deposited from OMTS was slightly lower compared to those deposited using TEOS. The shrinkage of the films (deposited from TEOS as well as OMTS) decreased with an increase in deposition temperature from 300° C. to 450° C., and then remained fairly constant at 500° C. at a shrinkage about 5%.

The shrinkage of the films can be attributed (based on thermal desorption studies) to the loss of water-related species such as $H_2O$, OH, O and $H_2$, $O_2$ and ethoxyl-group related species such as $OC_2H_5$, $OC_2H_4$, $C_2H5$ and $C_2H_4$ which arise due to incomplete decomposition of the precursor. Higher temperatures would lead to more complete decomposition of the precursor and therefore result in a lower shrinkage.

The carbon content of the films deposited using OMTS decreased from about $2 \times 10^{19}$ atom/cm$^3$ at 300° C.(200 torr and $O_3$:Si=10) to about $2.5 \times 10^{18}$ atom/cm$^3$ at 450° C.(200 torr $O_3$:Si=10). This is most likely due to the occurrence of more complete decomposition at higher temperatures. The carbon content of the films deposited from TEOS decreased from about $2 \times 10^{18}$ atom/cm$^3$ at 300° C.(200 torr and $O_3$:Si= 10) to about $1 \times 10^{18}$ atom/cm$^3$ at 450° C.(200 torr $O^3$:Si= 10). Thus, the carbon content in the films deposited from TEOS was lower, especially at lower deposition temperatures (300° C.).

The above data suggests that operating in the temperature range of 400–450° C. results in the best film quality in terms of deposition rate, WER and shrinkage for films deposited from TEOS and OMTS. Next, the effect of pressure was examined in this temperature range. The effect of temperature on the gap fill capability is discussed in a separate section below.

Figure 6:
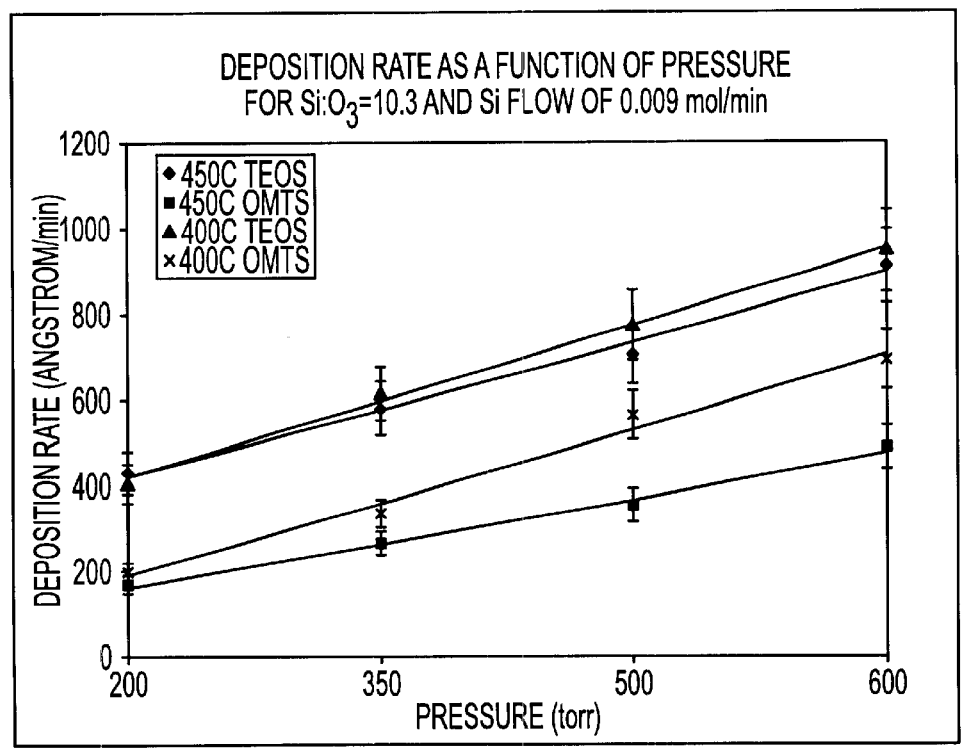
FIG. 6 is a graph of the deposition rate as a function of pressure for Si:$O_3$=10.3 and Si flow of 0.009 mol/min for a conventional precursor and for one precursor according to one embodiment of the present invention.

The operating pressure of the CVD chamber 22 was varied from 200 to 600 torr at 400° C. and 450° C. and its effect on the film properties was studied. The deposition rate using TEOS and OMTS increased with increasing pressure as illustrated in FIG. 6. This increase in the deposition rate can be attributed to an increase in the partial pressure of the precursors with the increase in pressure.

Although it is not shown in FIG. 6, the deposition rate at 400° C. using OMTS jumped up to 1000 Å/min at 700 torr. Considering that the flow rate of OMTS is nearly one-third that of TEOS for an equivalent amount of silicon available, one can use only one-third of the amount of OMTS and still achieve the same throughput as that provided from TEOS. This results in a significant reduction in the cost of ownership (CoC) of the CVD system and presents a significant advance in the art.

Figure 7:
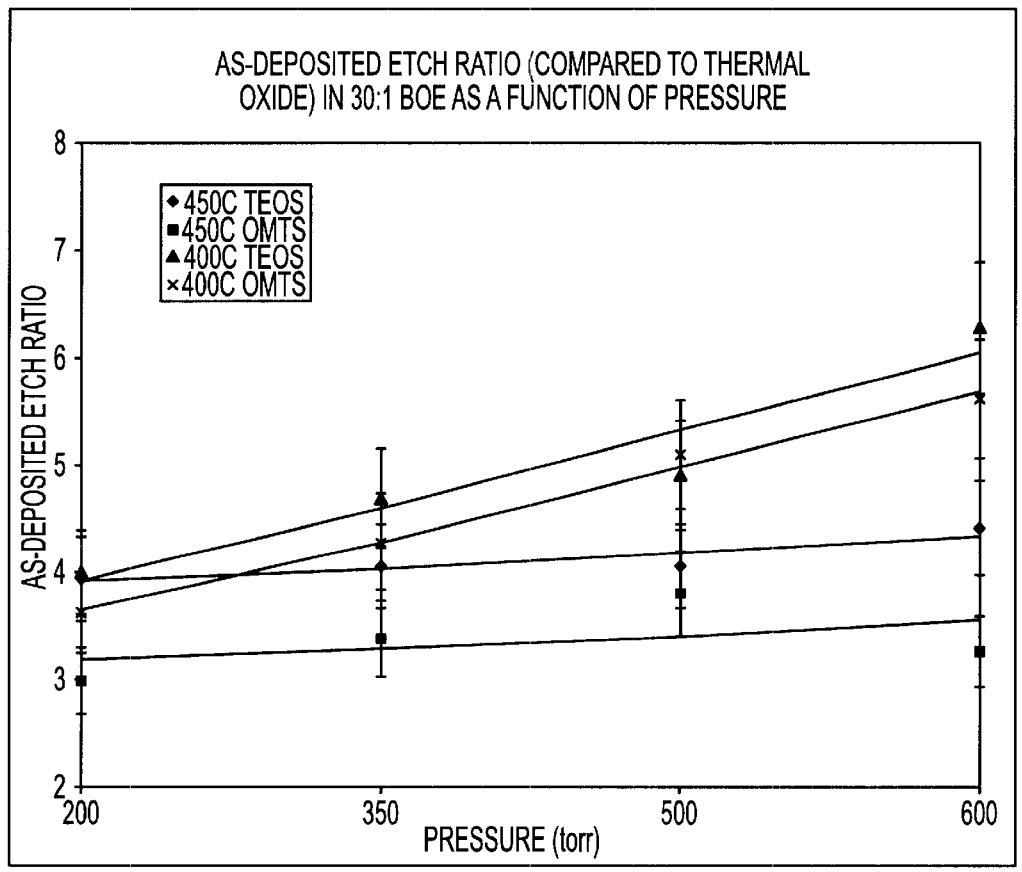
FIG. 7 shows the as-deposited etch ratio (compared to thermal oxide) in 30:1 BOE as a function of pressure for a conventional precursor and for one precursor of the present invention.

Referring to FIG. 7, it is further illustrated that increasing the pressure results in an increase in the WER of the films deposited using TEOS or OMTS at 400° C. However, the WER remained fairly constant with pressure at 450° C. This is consistent with the studies on TEOS reported in the literature. It is preferred to operate the method of the present invention at a temperature of 450° C. or higher instead of 400° C., so that variations in the pressure do not significantly affect the WER.

Figure 8:
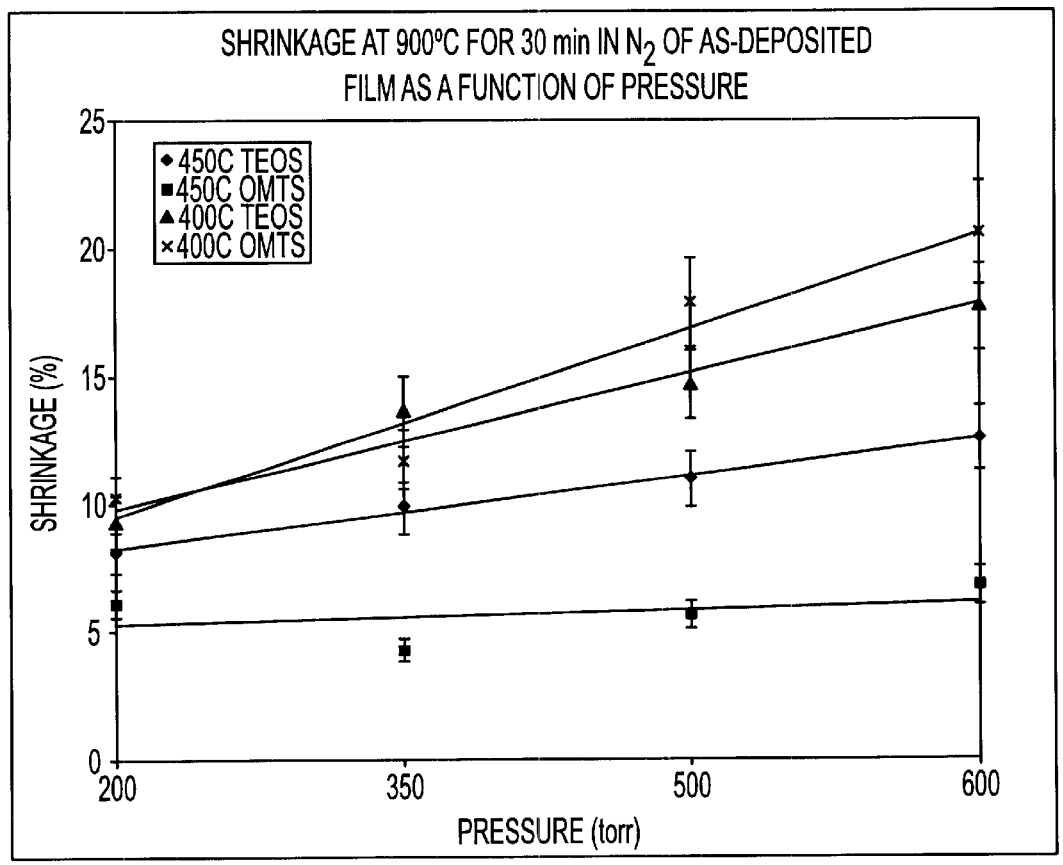
FIG. 8 demonstrates the shrinkage at 900° C. for 30 minutes in $N_2$ of as-deposited film as a function of pressure of a conventional precursor and for one precursor according to the present invention.

The effect of pressure on the shrinkage of the films is shown in FIG. 8. The data shows that shrinkage typically increases with pressure (i.e. an increase in deposition rate). It is possible that at higher pressures and higher deposition rates the decomposition of the precursor is relatively incomplete resulting in a greater amount of organic and water-like species being expelled during the annealing cycle. However, this needs further investigation in order to make any definite conclusions.

The carbon content in the films deposited using OMTS at 200 torr (450° C. and $O_3$:Si=10) remained constant at $2.5 \times 10^{18}$ atom/cm$^3$ when the pressure was increased to 600 torr. Similarly, the carbon content in the films deposited using TEOS at 200 torr (450° C. and $O_3$:Si=10) remained constant at $1 \times 10^{18}$ atom/cm$^3$ when the pressure was increased to 600 torr.

Figure 9:
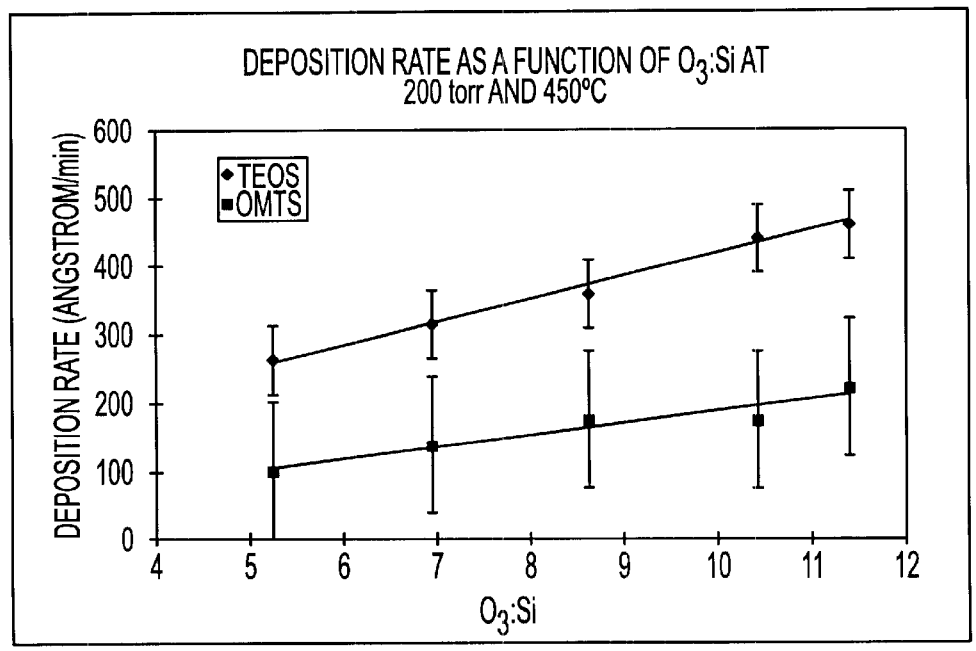
FIG. 9 illustrates the deposition rate as a function of $O_3$:Si at 200 torr and 450° C. for a conventional precursor and for one precursor of the present invention.

Next, the ozone to silicon concentration ratio ($O_3$: Si) was evaluated. FIG. 9 shows that increasing the $O_3$: Si ratio from approximately 5 to 11 results in a linear increase in the deposition rate for TEOS and OMTS. This is consistent with TEOS studies reported in the literature. The WER and the shrinkage did not show any appreciable change with increases in the $O_3$:Si ratio for both TEOS and OMTS. The WER remained constant at about 4 and 3 for TEOS and OMTS, respectively. The $O_3$:Si ratio did not affect the shrinkage which remained constant at about 8 and 6 for TEOS and OMTS, respectively.

In the manufacture of semiconductors, the gap fill capability of the film is of particular importance. As device densities shrink the gap fill capability of the film becomes even more critical. Of significant advantage, films deposited with the method of the present invention showed greatly improved gap fill capability over conventional TEOS films. The gap fill capability was thus evaluated and above analysis shows that operating at temperatures of about 400–500° C. result in a better film quality (low WER and shrinkage) compared to 300–400° C. for both, TEOS and OMTS. Therefore, the gap filling capability of films deposited according to the method of the present invention were compared to TEOS films at the following process conditions: temperature range of 400–500° C., pressures from 200 to 600 torr.

Figure 10A:
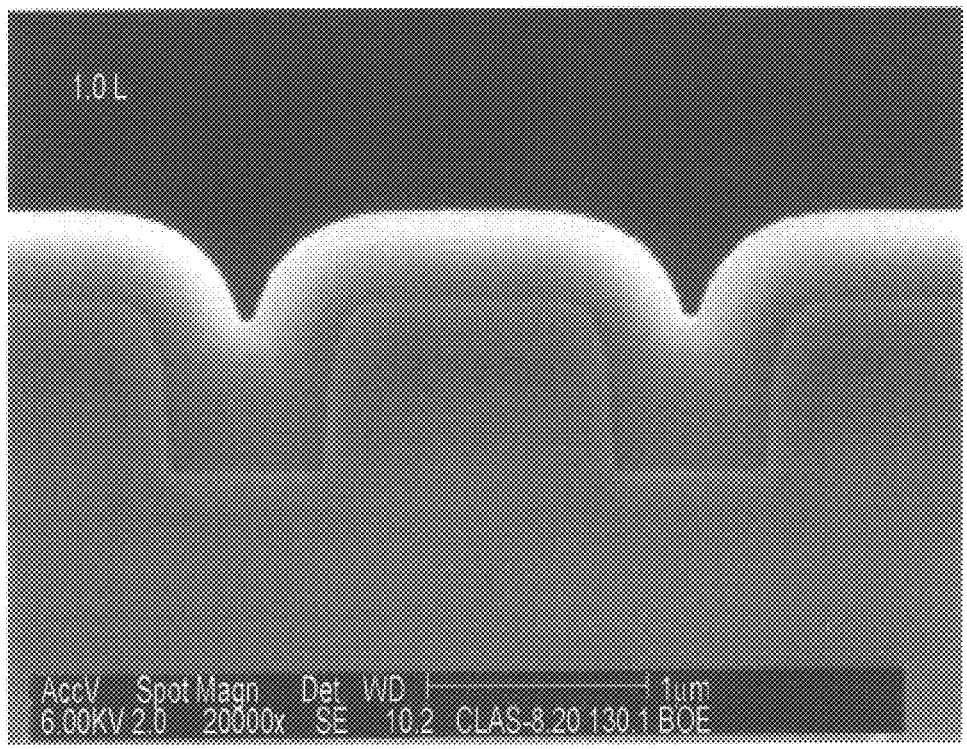
FIGS. 10a, b and c are scanning electron microscope photographs illustrating the gap fill capability of: a conventional precursor deposited at 450° C., 600 torr and $O_3$:Si= 10.3; and of two inventive precursors deposited at 500° C., 200 torr and O3: Si=5; and 500° C., 200 torr and $O_3$:Si=11.0; respectively.
Figure 10B:
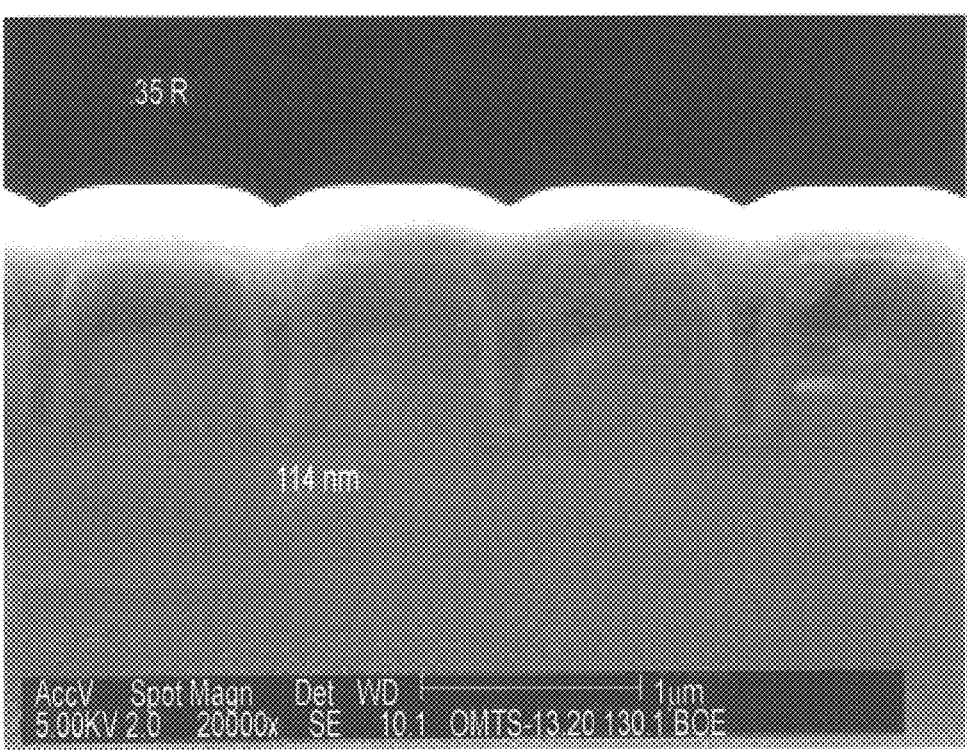
Figure 10C:
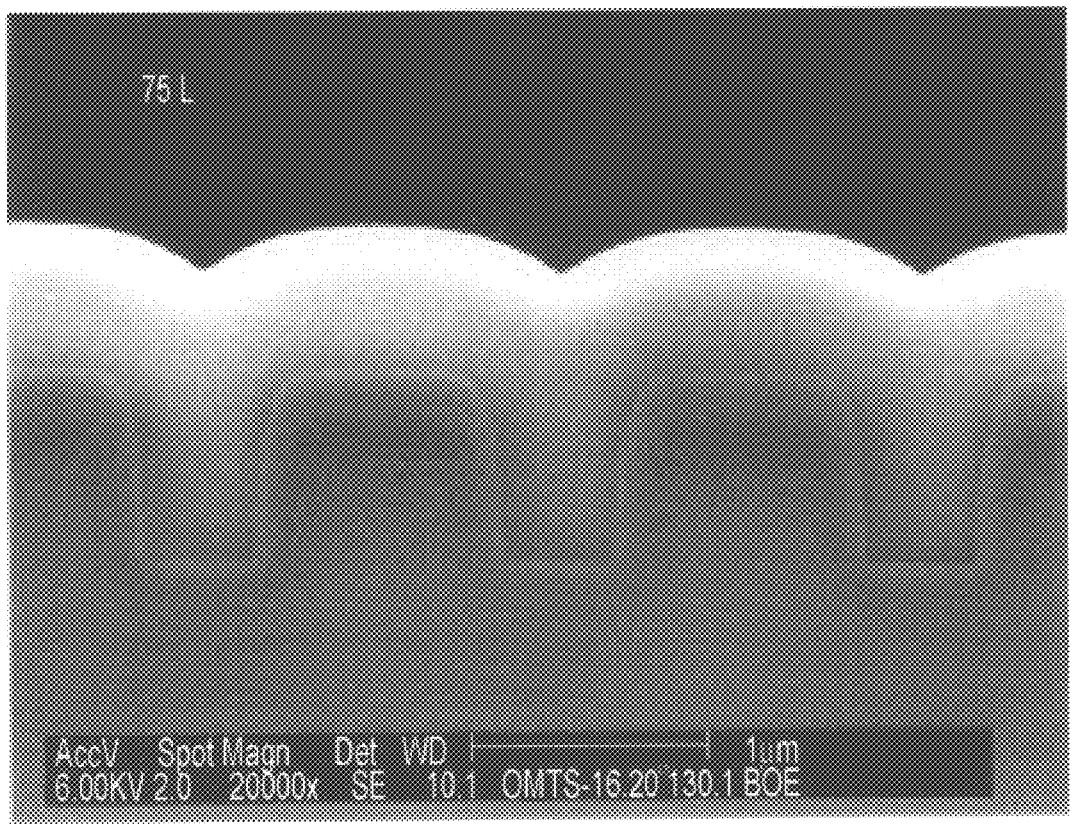

The smallest feature size that was completely filled using TEOS as the precursor was about 0.7 $\mu$m with an aspect ratio of 1.0 as shown in FIG. 10b. The TEOS film was deposited at 450° C., 600 torr and $O_3$:Si=10.3. Feature sizes smaller than 0.7 $\mu$m could not be filled either by varying the temperature (400° C. to 500° C.) or pressure (200 to 600 torr) using TEOS as the precursor.

The smallest feature size that was completely filled using OMTS as the precursor was about 100 nm with an aspect ratio of about 8 as shown in FIG. 10b. The OMTS film was deposited at 500° C., 200 torr and $O_3$:Si of about 5.0 (deposition rate of about 100 Å/min).

Figure 11:
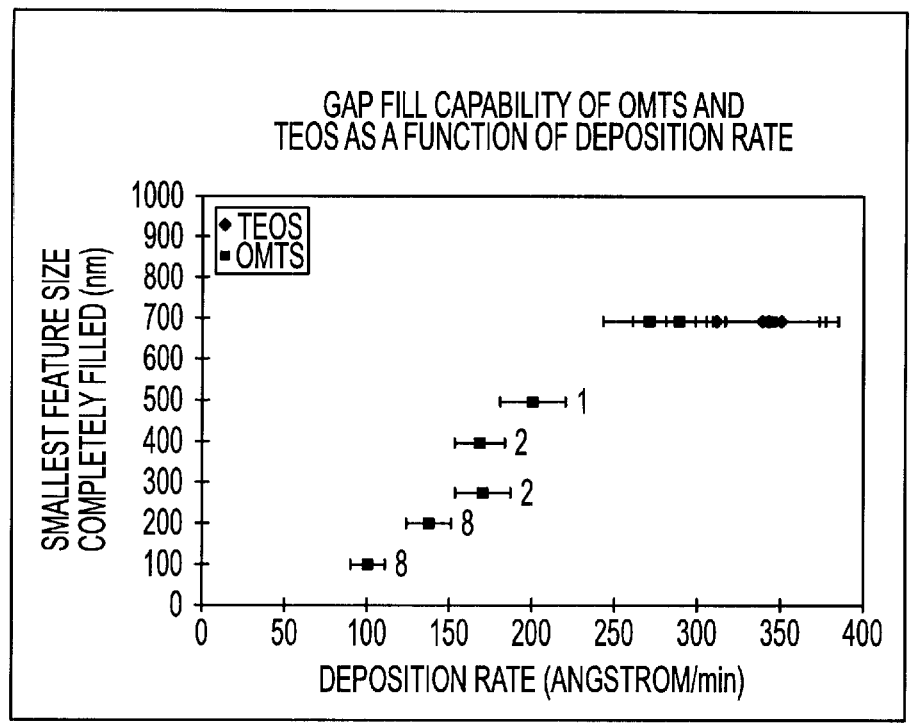
FIG. 11 shows the gap fill capability of OMTS and TEOS as a function of deposition rate.

The smallest feature size gap that was completely filled is plotted as a function of the deposition rate (which can be considered as a measure of the Thiele modulus) for films deposited with TEOS and OMTS as shown in FIG. 1. The number next to the data point in FIG. 11 represents the aspect ratio. The data points for deposition rates greater than 250 Å/min (in the top right corner) all represent an aspect ratio of 1.0. The data is consistent with the theoretical basis of the Thiele modulus. It explains that smaller feature sizes were completely filled using OMTS but not with TEOS.

Figure 12:
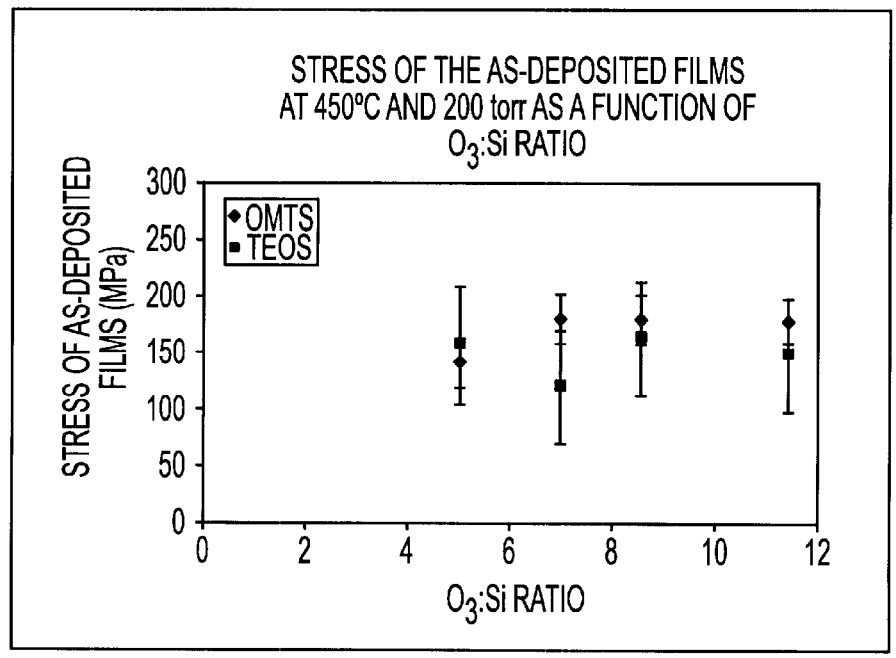
FIG. 12 illustrates the stress of the as-deposited films at 450° C. and 200 torr as a function of $O_3$:Si ratio of a conventional precursor and for a precursor of the present invention.

Finally, the stress of the films deposited from OMTS and TEOS was measured as a function of $O_3$: Si ratio at a deposition temperature of 450° C. and at a pressure of 200 torr. The data is shown in FIG. 12 which illustrates that the stress of the as-deposited films is tensile and remains fairly constant with an increase in the $O_3$:Si ratio for both TEOS and OMTS. Further, the as-deposited stress of the films from the two precursors seem to be comparable.

Of further advantage, the method of the present invention promotes the reduction of the detrimental powder buildup. With the prior art TEOS methods, significant powder (typically the oxide and by-products) formation occurs during the CVD reaction. The powder deposits on the injector and chamber surfaces, clogs the exhaust lines and damages the pumps. The powder becomes a significant source of particulate contamination in the films. The powder buildup decreases the longevity of the CVD system and increases the downtime of the system since the powder must be frequently cleaned from the surfaces. The alkylsiloxane precursor of the present invention reduces the powder build-up because to deposit the same amount of oxide, less chemical is required which in turn generates a lower amount of by-products. Further, the inventors believe that the alkylsiloxane compound, in particular OMTS, is more stable than TEOS, and is less likely to react in the gas phase thereby generating less particles.

Experiments Conducted at Atmospheric Pressure

In another illustrative embodiment of the present invention, the inventive method was practiced in a commercially available WJ-999 APCVD system which operates at atmospheric pressure. Only the first two chambers were used for deposition due to flow containment problems. The system was profiled at each temperature set point such that the left, right and center were within 5° C. of each other. The bubbler temperatures for OMTS were dropped to 50° C. (compared to 75° C. for TEOS) in order to reduce the chemical flow from 60 sccm per chamber (for TEOS) to 20 sccm per chamber (for OMTS). No other changes were made to the system. The OMTS, nitrogen, and ozone gas flows combined through the injector ports were maintained at 6 slm, 14 slm and 10 slm through the inner, separator and outer ports, respectively. The ozone concentration was varied at each temperature from 158–66 /gm$^3$ such that the $O_3$:Si ratio varied as 12, 10, 7 and 5. The deposition temperature was varied from 350° C. to 550° C. in steps of 50° C. No dopants were added to the system.

The film thickness was measured using a Prometrix spectromap (Model SM200/E) using 49 points with a 6 mm edge exclusion. The wafers with the as-deposited films were etched in a 30:1 BOE solution maintained at room temperature and the thickness before and after the etch was measured to determine the etch rate. The wafers were annealed in a furnace (Canary, NOBLE IPS 812) at 900° C. for 30 min in a $N_2$ ambient. Shrinkage was determined by the thickness measurements before and after the anneal. Stress was measured on a stress gauge (Tencor, FLX-2410) in a dry $N_2$ ambient. The patterned wafers were analyzed by Secondary Electron Microscopy (SEM) (Philips XL40 FEG) to measure the extent of gap fill. They were etched for 20 sec in a 30:1 BOE solution.

Experiments to deposit $SiO_2$ films from TEOS and OMTS were conducted under a wide range of process conditions. The comparison between the films deposited from TEOS and OMTS is based on the mole basis of Si rather than mole basis of precursor.

The deposition temperature was varied from 350–550° C. and its effect on the deposition rate and film properties such as wet etch ratio, shrinkage and gap fill capability was studied at four different values of $O_3$:Si. The results for TEOS and OMTS are compared as illustrated in FIGS. 13, 14 and 15.

Figure 13:
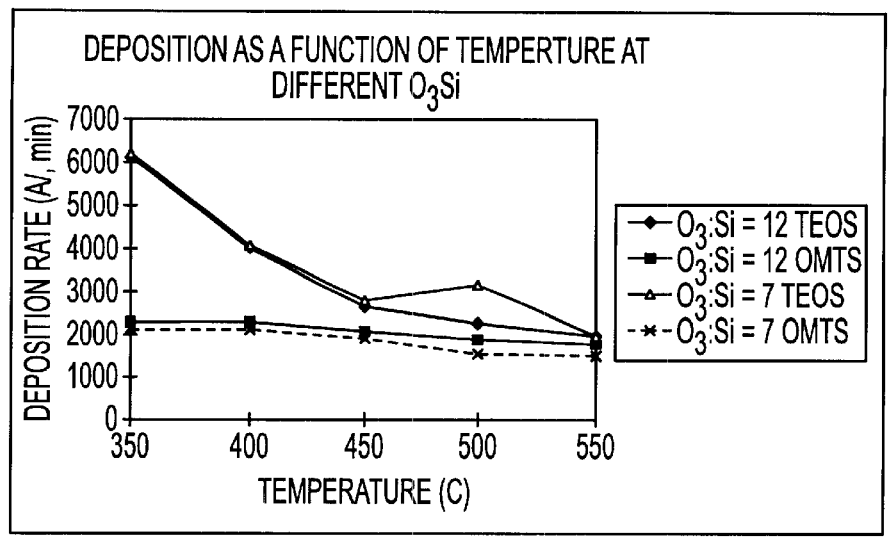
FIG. 13 is a graph showing deposition rate as a function of temperature at different $O_3$:Si ratios carried out at atmospheric pressure according to another embodiment of the present invention.
Figure 14:
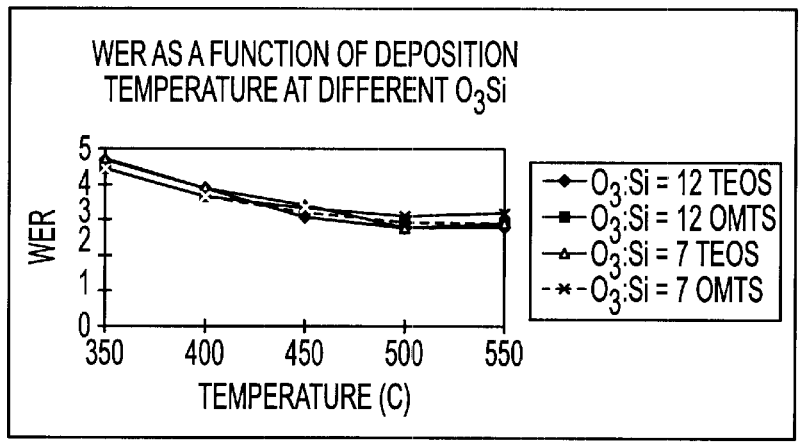
FIG. 14 illustrates WER as a function of deposition temperature at different $O_3$Si ratios carried out at atmospheric pressure.

Specifically, FIG. 13 shows that the deposition rate for OMTS remained fairly constant when the deposition temperature was increased from 350 to 550° C. at around 2000 Å/min. In contrast, the deposition rate with TEOS decreased sharply with an increase in the deposition temperature. It is interesting to note that at lower temperatures there is a significant difference in the deposition rate of TEOS and OMTS. However, at temperatures of 500° C. or higher the two rates are comparable even though the flow rate of OMTS was one-third of TEOS. This suggests that the reactivity of OMTS may be lower than that of TEOS and consequently the deposition rate is less sensitive to changes in the deposition temperature. In other words, OMTS exhibits lower temperature sensitivity than TEOS, and thus films deposited with OMTS can exhibit lower thickness non-uniformity than films deposited with TEOS.

The wet etch ratio (WER) was determined by comparing the etch rate of the CVD film to the etch rate of a thermal oxide. The data in FIG. 14 shows that the WER for OMTS and TEOS were comparable and decreased with increase in the deposition temperature as expected.

Figure 15:
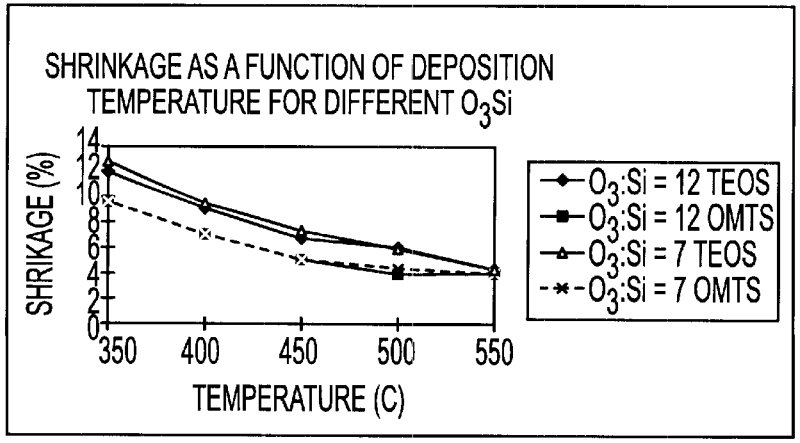
FIG. 15 demonstrates shrinkage as a function of deposition temperature for different $O_3$:Si ratios carried out at atmospheric pressure.

The shrinkage of the $SiO_2$ films deposited from TEOS and OMTS at different deposition temperatures is presented in FIG. 15. The shrinkage of the films from OMTS was slightly lower compared to those deposited using TEOS, especially at temperatures below 400° C. The shrinkage of the films (deposited from TEOS as well as OMTS) decreased with increase in deposition temperature from 350° C. to 500° C. and then remained fairly constant at 500° C. at about 4.5%.

Figure 16:
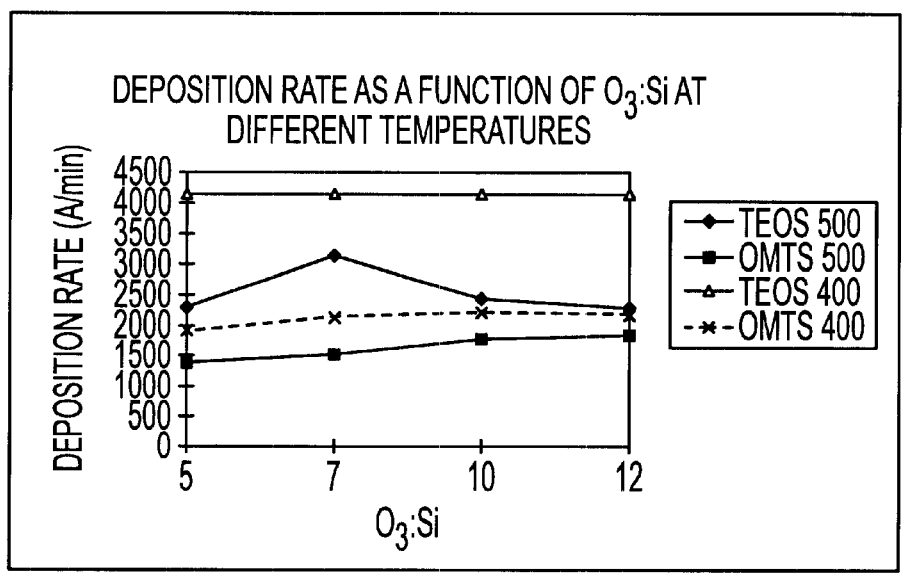
FIG. 16 shows deposition rate as a function of $O_3$:Si at different temperatures at atmospheric pressure.

FIG. 16 shows that increasing the $O_3$:Si ratio from about 5 to 12 resulted in a linear increase in the deposition rate for OMTS. However, the deposition rate in the case of TEOS showed a maximum with respect to the $O_3$:Si ratio. This data further demonstrates the lower reactivity of OMTS (compared to TEOS) in the gas-phase. The WER and the shrinkage did not show any appreciable change with increase in the $O_3$:Si ratio for both TEOS and OMTS.

Figure 17A:
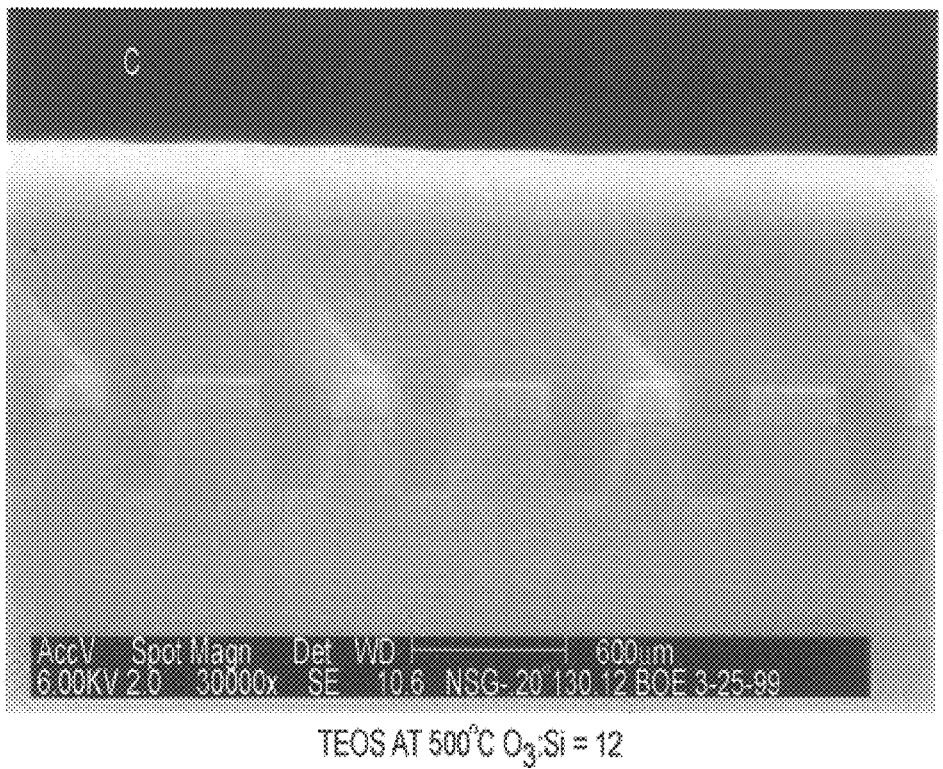
FIGS. 17a, b and c are scanning electron microscope photographs showing gap fill of layers deposited with a.) TEOS at 500° C. and $O_3$:Si=12; b.) TEOS at 550° C. and $O_3$:Si=12; and c.) TEOS at 450° C. and $O_3$:Si=12 at atmospheric pressure.
Figure 17B:
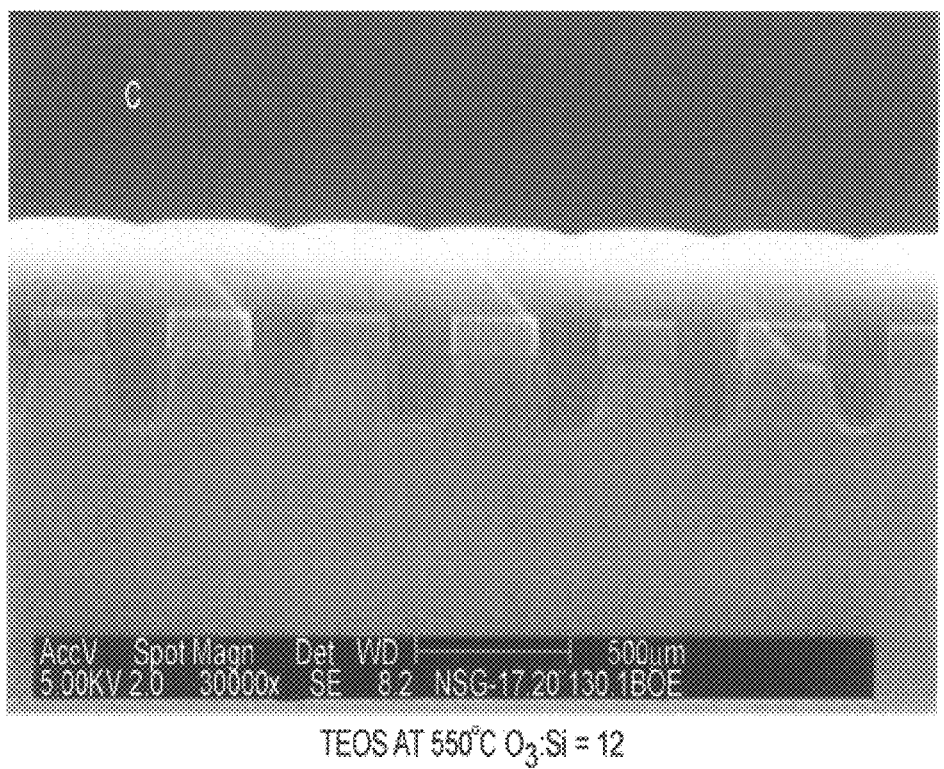
Figure 17C:
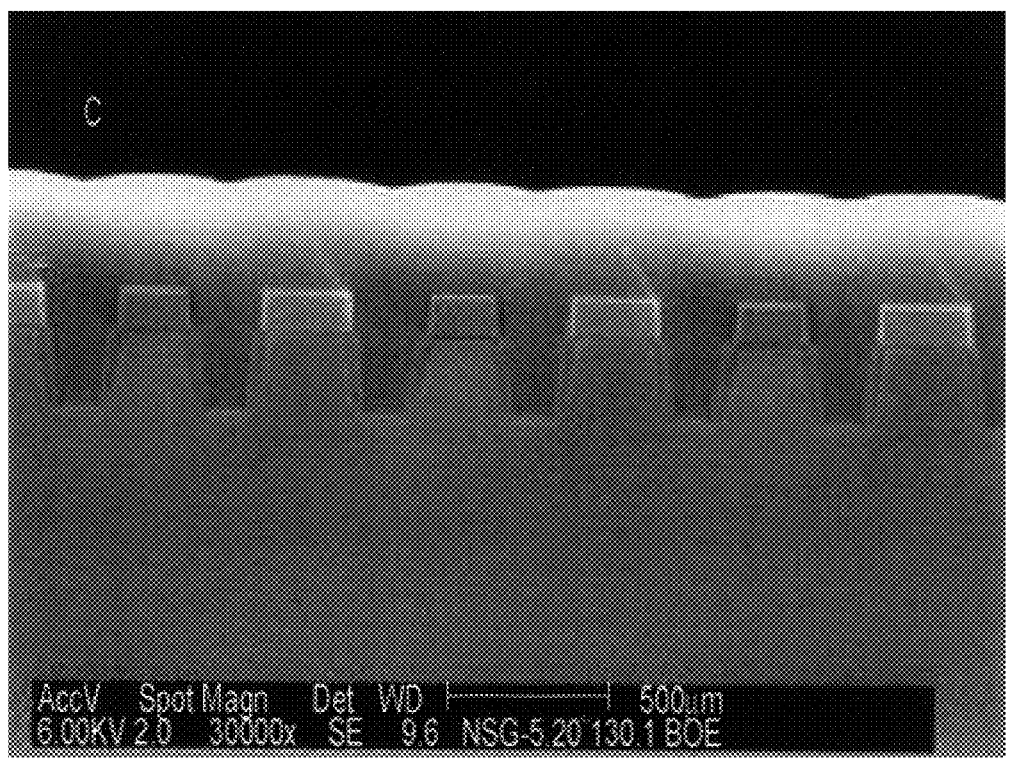

The gap filling ability of the precursors was evaluated on the IBM STI wafers and the results are therefore discussed with these structures in mind. Scanning electron microscope (SEM) photographs showing the gap fill achieved by a TEOS process at different process conditions are shown in FIGS. 17a–c. The Figures show that TEOS is able to completely fill the gaps of size 0.13 μm and aspect ratio of about 2 with sloped sidewalls at temperatures of 500° C. or higher (FIG. 17a). However, at 550° C. seams were apparent (FIG. 17b). At temperatures of 450° C. or below seams are apparent in the structures although there is no keyhole formation (FIG. 17c). The gap filling ability on average decreases with a decrease in the $O_3$:Si ratio.

Figure 18A:
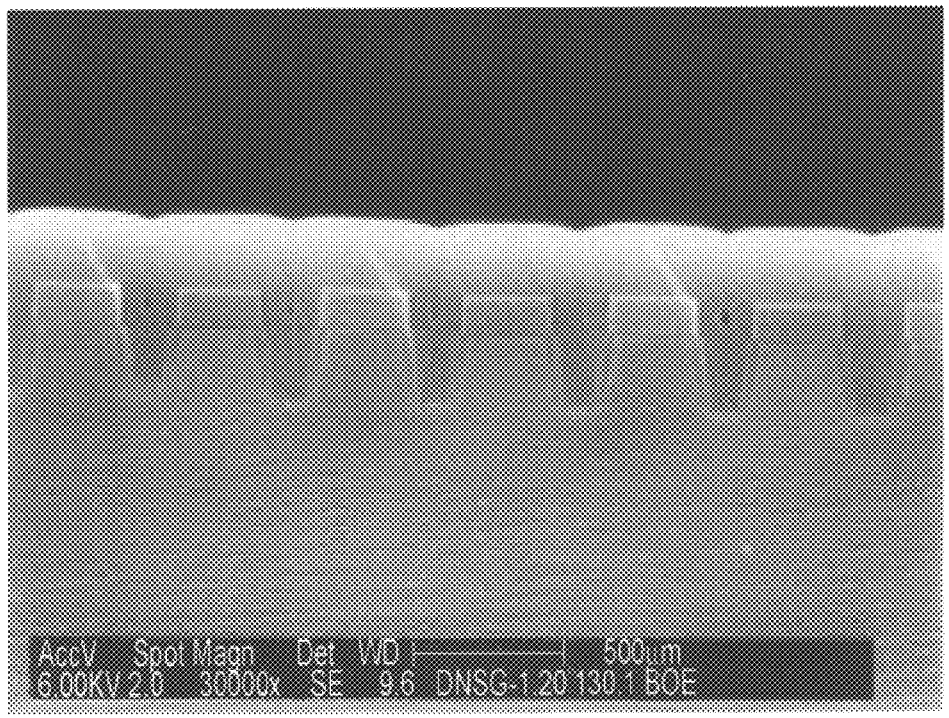
FIGS. 18a, b and c are scanning electron microscope photographs showing gap fill of layers deposited with a.) OMTS at 500° C. and $O_3$:Si=12; b.) OMTS at 550° C. and $O_3$:Si=12; and c.) OMTS at 450° C. and $O_3$:Si=12 at atmospheric pressure.
Figure 18B:
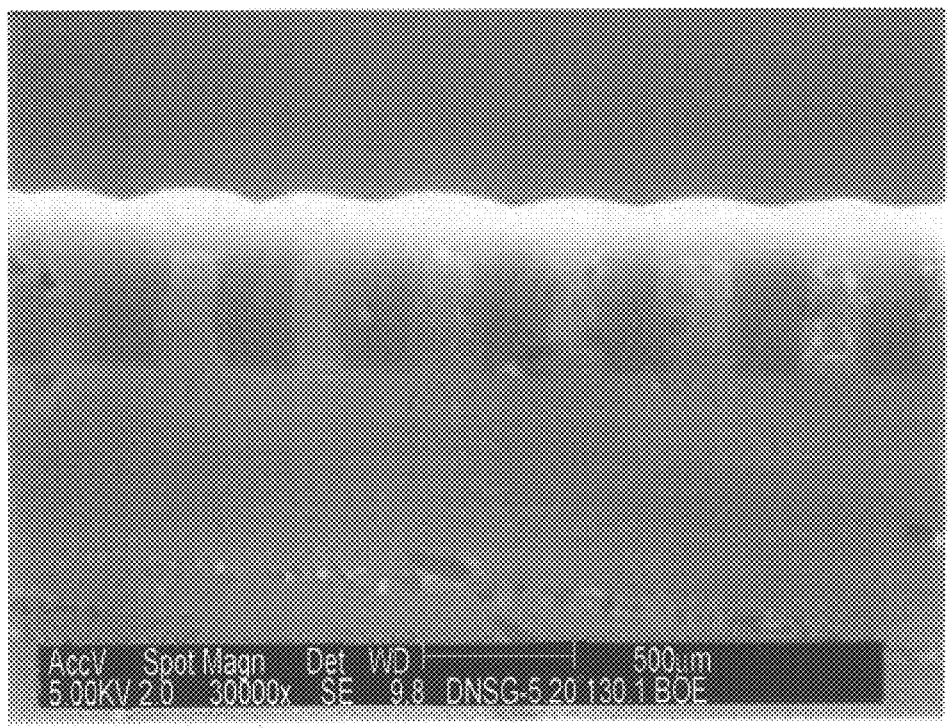
Figure 18C:
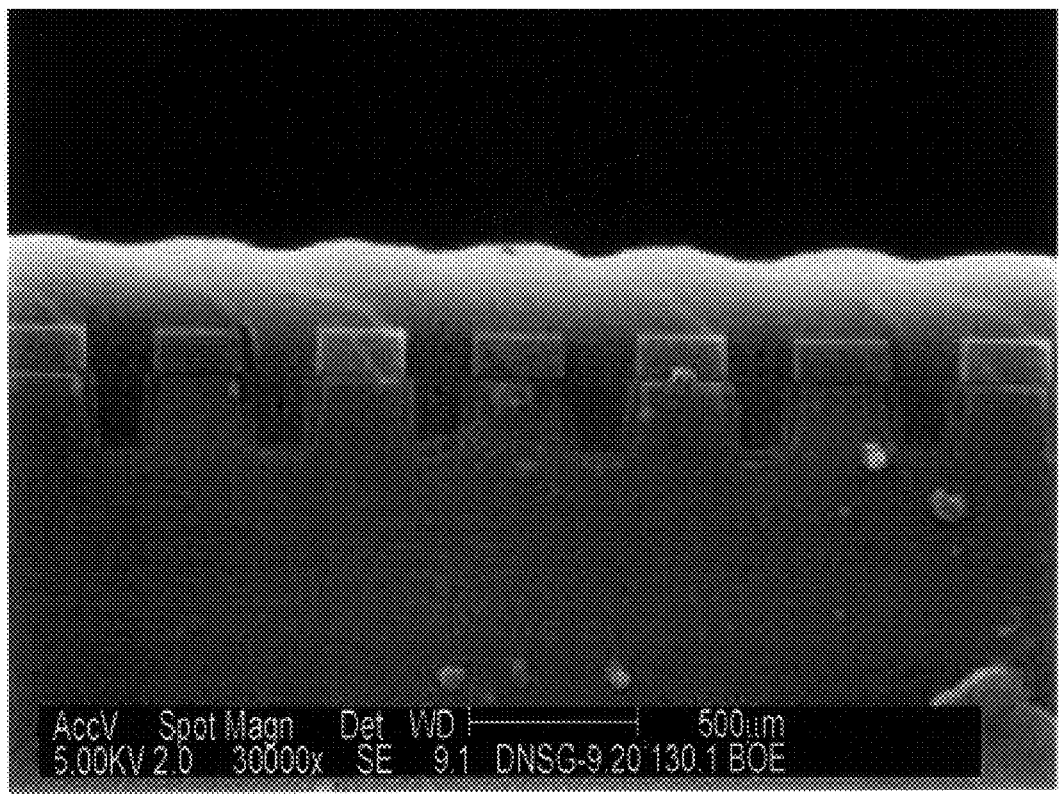

The same trends were manifested by OMTS as well, as illustrated in the SEM photographs of FIGS. 18a–c. The gap fill was complete at 500° C. (FIG. 18a) whereas at 550° C. seams were apparent (FIG. 18b) and 450° C. (FIG. 18c).

However, in case of OMTS the gap fill ability dropped sharply with decrease in the $O_3$:Si ratio compared to TEOS. It should be mentioned that the gap fill ability for OMTS may be improved by further increasing the $O_3$:Si ratio.

Figure 19:
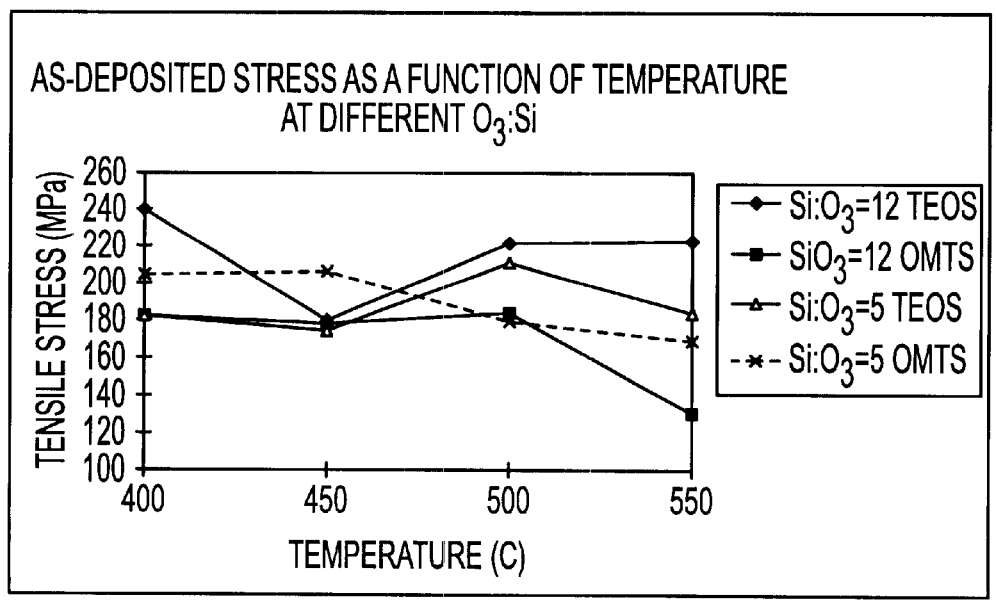
FIG. 19 shows the as-deposited stress as a function of temperature at different $O_3$:Si ratios carried out at atmospheric pressure.

The stress of the films deposited from OMTS and TEOS was measured as a function of the deposition temperature and the data is presented in FIG. 19. The stress of the as-deposited films was tensile in all cases. Because some of the wafers were measured within 30 minutes of the runs while others were measured after 2–3 hr. (due to constraints on the logistics) the data should be viewed only qualitatively. The data shows that the as-deposited stress of the films deposited using TEOS and OMTS was comparable. In case of TEOS, higher $O_3$:Si ratio leads to a higher as-deposited stress. The trend seems to be the opposite in case of OMTS. No other definitive conclusions are possible.

Silicon dioxide films deposited using alkylsiloxane precursors show qualities such as the wet etch ratio, shrinkage, carbon content and gap filling ability that are comparable to the films deposited from TEOS. Further, this precursor costs less than TEOS and results in a lower generation of by-products compared to TEOS. This can result in enhanced longevity of the injectors and CVD chambers. The deposition rate of the films using OMTS, is lower than that of OMTS in the range of conditions explored since one-third the amount of chemical was used. However, the deposition rate is comparable to that of TEOS even when one-third of OMTS (compared to TEOS) is used.

While the present invention has been described with reference to a few specific embodiments, the description is illustrative and is not to be construed as limiting the invention. Various modifications may occur to those of ordinary skill in the art without departing from the scope of the invention.

We claim:

1. A method of depositing an oxide film on the surface of a semiconductor substrate in a chemical vapor deposition (CVD) system having at least one chamber, comprising the steps of:

providing an alkylsiloxane precursor having the general formula of:

$(CH_3)_3Si[OSi(CH_3)_2]n\ OSi(CH_3)_3$ where n is 1 or 2 to said chamber;

providing ozone to said chamber; and thermally reacting said alkylsiloxane precursor and ozone to deposit an oxide film on the surface of the substrate.

2. The method of claim 1 wherein said thermally reacting step is carried out at a temperature in the range of approximately 300° C. to 600° C., and said chamber is maintained at a pressure in the range of approximately 100 to 700 torr.

3. The method of claim 2 wherein said thermally reacting step is carried out at a temperature in the range of approximately 200° C. to 600° C., and said chamber is maintained at approximately atmospheric pressure.

4. The method of claim 1 wherein the alkylsiloxane and ozone are provided at a molar concentration ratio expressed as ozone to silicon ($O_3Si$) in the range of approximately 5 to 15 at a pressure of approximately 200 to 600 torr.

5. The method of claim 1 wherein the alkylsiloxane and ozone are provided at a molar concentration ratio expressed as ozone to silicon ($O_3Si$) in the range of approximately 5 to 15 at a pressure of approximately atmospheric pressure.

6. The method of claim 1 wherein said alkylsiloxane precursor is selected from a group of octamethyltrisiloxane and decamethyltetrasiloxane.

* * * * *